United States Patent
Wang et al.

(10) Patent No.: US 9,097,946 B2
(45) Date of Patent: Aug. 4, 2015

(54) DISPLAY PANEL

(75) Inventors: Chih-Hao Wang, Hsin-Chu (TW);
Po-Fu Huang, Hsin-Chu (TW);
Chih-Hung Chen, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 202 days.

(21) Appl. No.: 13/435,043

(22) Filed: Mar. 30, 2012

(65) Prior Publication Data

US 2013/0120329 A1    May 16, 2013

(30) Foreign Application Priority Data

Nov. 15, 2011   (TW) .............................. 100141634 A

(51) Int. Cl.
*G02F 1/1345* (2006.01)
*G02F 1/1333* (2006.01)
*G06F 3/038* (2013.01)
*G09G 5/00* (2006.01)
*H01L 23/00* (2006.01)

(52) U.S. Cl.
CPC *G02F 1/13452* (2013.01); *G02F 2001/133388* (2013.01); *H01L 24/16* (2013.01); *H01L 24/29* (2013.01); *H01L 2224/131* (2013.01); *H01L 2224/16225* (2013.01); *H01L 2224/293* (2013.01); *H01L 2224/29298* (2013.01); *H01L 2224/83385* (2013.01); *H01L 2924/07811* (2013.01)

(58) Field of Classification Search
CPC ............ G02F 1/1333; G02F 1/133345; G02F 1/13452; G02F 1/13454; G02F 1/13458; G02F 2001/133357; G02F 2001/133388; G02F 2001/1345; G02F 2001/3505; G02F 2201/07; G02F 2201/48; G02F 2201/50; G09G 3/2092; G09G 3/2096; G09G 5/003; G09G 2310/0264; G09G 2310/0281; G09G 2320/00; H01L 21/02107; H01L 21/31; H01L 21/768; H01L 21/76801; H01L 21/76819; H01L 21/7684; H01L 21/76841; H01L 23/5329; H01L 23/48; H01L 23/485; H01L 23/488; H01L 23/52; H01L 24/10
See application file for complete search history.

(56) References Cited

U.S. PATENT DOCUMENTS

| 6,985,193 | B2 * | 1/2006 | Jang ................................ 349/43 |
| 7,599,038 | B2 * | 10/2009 | Oda ............................... 349/149 |
| 2007/0045841 | A1 * | 3/2007 | Cho et al. ....................... 257/737 |
| 2010/0149473 | A1 * | 6/2010 | Guo et al. ...................... 349/122 |

FOREIGN PATENT DOCUMENTS

| TW | 479304 | 3/2002 |
| TW | 200715514 | 4/2007 |

* cited by examiner

*Primary Examiner* — Paisley L Arendt
*Assistant Examiner* — Angela Davison
(74) *Attorney, Agent, or Firm* — WPAT, PC; Justin King

(57) ABSTRACT

A display panel includes a display area, a non-display area, a plurality of signal pads and a passive covering layer. The non-display area is adjacent to the display area. The signal pads are disposed within the non-display area. The passive covering layer is disposed on the display area and extends to cover at least a portion of the non-display area. The passive covering layer has a first thickness within the display area. The passive covering layer has a second thickness within the non-display area. The first thickness is greater than the second thickness.

8 Claims, 6 Drawing Sheets

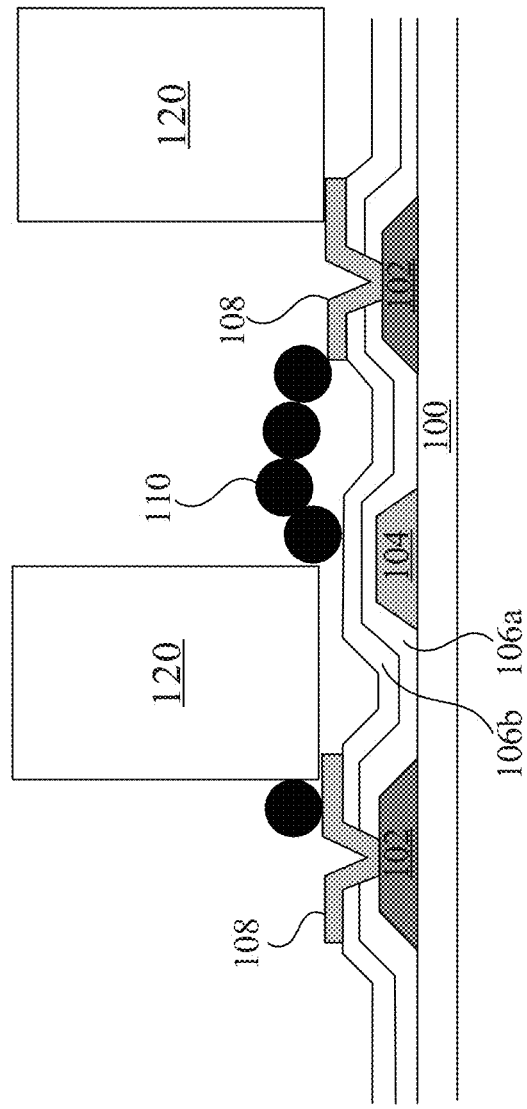

DISPLAY PANEL

RELATED APPLICATIONS

This application claims priority to Taiwan Patent Application Serial Number 100141634, filed Nov. 15, 2011, which is herein incorporated by reference.

BACKGROUND

1. Technical Field

The present disclosure relates to a display. More particularly, the present disclosure relates to a display panel and a structural design of a non-display area thereon.

2. Description of Related Art

In recent years, technology related to display devices has improved significantly. Digital display panels have the advantages of compact size, low cost and high performance. Components within digital display panels are highly integrated using advanced processes, so as to achieve optimal display quality in a small size and with a low total cost.

For example, the Chip-On-Glass (COG) packing technique is utilized to place the integrated circuit (IC) of a digital display panel directly onto a glass substrate. Due to the high resolution of modern display panels, the integrated circuit used therein must accommodate a significant number of pins utilizing a small packing space and thickness. The Chip-On-Glass packing technique eliminates the need for a substrate or copper foil used in a traditional packing technique. Therefore, with the use of the Chip-On-Glass packing technique, the overall thickness of the display device can be reduced, and this is in line with recent trends toward reduced profiles for display panels and contributes to higher resolution in modern display panels.

With the present Chip-On-Glass packing technique, a driving integrated circuit for the display panel is integrated onto a non-display area located on the edges of the display panel. The driving integrated circuit is electrically connected to signal pads on the non-display area. Electronic signals are conducted from the signal pads via metal signal traces to the display area of the display panel, in order to drive the display-driving units (e.g., thin film transistors, TFTs) within the display area.

Reference is made to FIG. 1A, which is a sectional diagram illustrating a non-display area within a traditional display panel. As shown in FIG. 1A, there are several signal pads 102 disposed on a substrate 100. Transparent conductive layers 108, e.g., Indium Tin Oxide (ITO) conductive layers, are disposed on the signal pads 102. With the use of traditional solutions, an integrated circuit (not shown) is connected to the conductive layers 108 through metal bumps 120 (e.g., IC bumps), and is further electrically connected with the signal pads 102.

In an ideal case, during the manufacturing process, these IC bumps (i.e., metal bumps 120) press down conductive particles 110 toward the conductive layers 108 above the signal pads 102, so as to complete the electrical connection as shown in FIG. 1A. FIG. 1B and FIG. 1C are sectional diagrams illustrating the traditional display panel when some shifting errors occur during manufacture.

As shown in FIG. 1B, a metal signal trace 104 can be disposed between two signal pads 102. If a shifting error occurs when the IC bumps 120 are pressed downward, the conductive particles 110 may be pressed to penetrate the isolation structure (e.g., a gate isolation layer 106a and a passivation layer 106b) above the metal signal trace 104, such that the metal signal trace 104 is short-circuited to the signal pad 102. In order to prevent the conductive particles 110 from penetrating the isolation structure, the tolerance range of the Chip-On-Glass packing technique is set so that there is no overlapping with the area above the metal signal traces 104. Hence, the tolerance range with the conventional Chip-On-Glass packing technique is extremely limited.

In another case as shown in FIG. 1C, a beaded drainage may be formed by several conductive particles 110, and as a result, two signal pads 102 can be short-circuited via the beaded drainage.

SUMMARY

In order to solve aforesaid problems, the invention provides a display panel. A passive covering layer is disposed on a display area of the display panel. The passive covering layer can be used to elevate an aperture ratio of the display area, and the passive covering layer extends to cover at least a portion of a non-display area of the display panel. The passive covering layer extending to the non-display area may provide a covering of a specific thickness in order to prevent conductive particles from penetrating an isolation structure and electrically connecting to metal signal traces under the isolation structure. Furthermore, a protruding structure or a concave structure can be disposed on or in the passive covering layer between two signal pads, so as to prevent the formation of a beaded drainage by the conductive particles.

An aspect of the invention is to provide a display panel, which includes a display area, a non-display area, a plurality of signal pads and a passive covering layer. The non-display area is adjacent to the display area. The signal pads are disposed within the non-display area. The passive covering layer is disposed on the display area and extends to cover at least a portion of the non-display area. The passive covering layer has a first thickness within the display area. The passive covering layer has a second thickness within the non-display area. The first thickness is greater than the second thickness.

According to an embodiment of the invention, the display panel further includes a plurality of conductive patterns disposed above the signal pads.

According to an embodiment of the invention, the display panel further includes a plurality of metal bumps. The metal bumps are disposed above the signal pads within the non-display area. The metal bumps are electrically connected to the signal pads and to an integrated circuit chip.

According to an embodiment of the invention, the display panel may include a plurality of conductive particles. At least some of the conductive particles are disposed between the metal bumps and the conductive patterns, so as to electrically connect the metal bumps to the signal pads.

According to an embodiment of the invention, the second thickness is greater than a diameter of the conductive particles.

According to an embodiment of the invention, the display panel further includes a plurality of metal signal traces disposed within the non-display area. The metal signal traces are vertically interlaced with the signal pads.

According to an embodiment of the invention, the passive covering layer has a protruding structure. The protruding structure forms a third thickness on the passive covering layer above the metal signal traces. The third thickness is greater than the second thickness.

According to an embodiment of the invention, the passive covering layer has a concave structure. The concave structure forms a fourth thickness on the passive covering layer above the metal signal traces. The fourth thickness is less than the second thickness.

Another aspect of the invention is to provide a display panel includes a substrate, a display-driving unit, a first signal pad, a passive covering layer and a first conductive layer. The substrate includes a display area and a non-display area. The non-display area is adjacent to the display area. The display-driving unit is disposed within the display area. The first signal pad is disposed within the non-display area. The passive covering layer is disposed on the display area and extends to cover the first signal pad. The first conductive layer is disposed extending through the passive covering layer and located above the first signal pad. The first conductive layer is electrically connected with the first signal pad.

According to an embodiment of the invention, the display-driving unit further includes a first metal layer, a gate isolation layer, a semiconductor layer, a second metal layer and a passivation layer. The first metal layer is disposed on the substrate. The semiconductor layer is disposed on the gate isolation layer. The second metal layer is disposed on the semiconductor layer. The passivation layer is disposed on the second metal layer and contacted with the gate isolation layer. The passive covering layer is disposed on the passivation layer.

According to an embodiment of the invention, the display panel further includes an integrated circuit chip. The integrated circuit chip is electrically connected with the first signal pad.

According to an embodiment of the invention, the display panel further includes a second signal pad disposed on the non-display area. The passive covering layer extends to cover the second signal pad. The passive covering layer has a protruding structure or a concave structure. The protruding structure or the concave structure is disposed between the first signal pad and the second signal pad.

According to an embodiment of the invention, the display panel further includes a second signal pad and a second conductive layer. The second signal pad is disposed on the non-display area. The passive covering layer extends to cover the second signal pad. The second conductive layer is disposed extending through the passive covering layer and located above the second signal pad. The second conductive layer is electrically connected with the second signal pad. The passive covering layer has a protruding structure or a concave structure. The protruding structure or the concave structure is disposed between the first conductive layer and the second conductive layer.

According to an embodiment of the invention, the display panel further includes a plurality of metal signal traces and a plurality of signal pads. The metal signal traces are disposed within the non-display area. The metal signal traces are vertically interlaced with the signal pads.

According to an embodiment of the invention, the passive covering layer has a protruding structure or a concave structure. The protruding structure or the concave structure is disposed above the metal signal traces. A vertical projection of the protruding structure or the concave structure overlaps the metal signal traces.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiments, with reference to the accompanying drawings as follows:

FIG. 1B and FIG. 1C are sectional diagrams illustrating the traditional display panel when some shifting errors occur during manufacture;

DESCRIPTION OF THE EMBODIMENTS

In the following description, several specific details are presented to provide a thorough understanding of the embodiments of the present invention. One skilled in the relevant art will recognize, however, that the present invention can be practiced without one or more of the specific details, or in combination with or with other components, etc. In other instances, well-known implementations or operations are not shown or described in detail to avoid obscuring aspects of various embodiments of the present invention.

Figure 2:
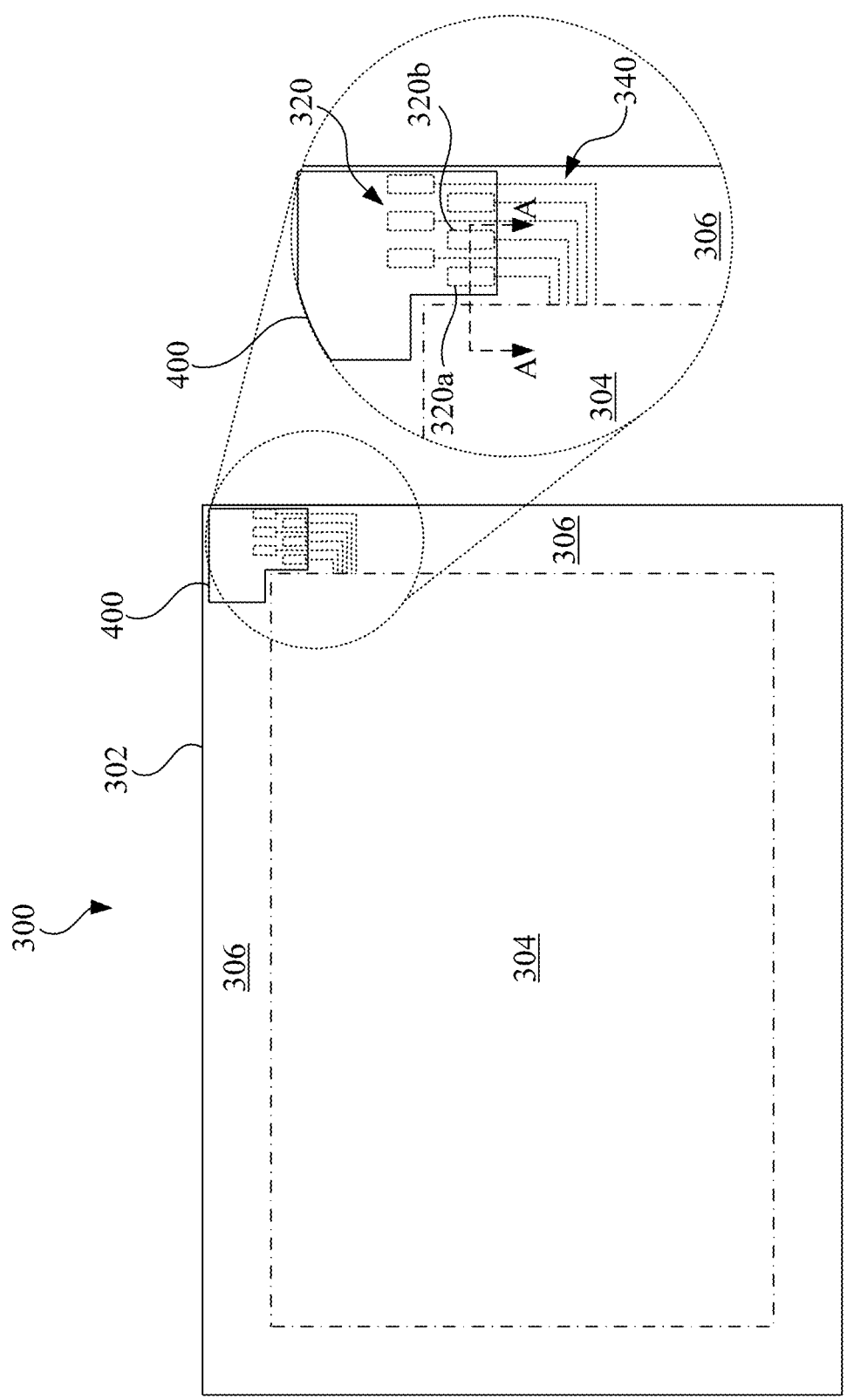
FIG. 2 is a top view illustrating a display panel according to an embodiment of the invention.

Reference is made to FIG. 2, which is a top view illustrating a display panel 300 according to an embodiment of the invention. As shown in FIG. 2, a substrate 302 on the display panel 300 includes a display area 304 and a non-display area 306. In the embodiment, the display area 304 is located substantially at the center part of the display panel 300, and the non-display area 306 is located substantially at edges of the display panel 300 and adjacent to the display area 304 (i.e., at edges of the display panel 300 surrounding the display area 304). However, the invention is not limited thereto. For example, the non-display area 306 may be located adjacent to one side of the display area 304.

In this embodiment, there are several signal pads 320 (including first signal pads 320a and second signal pads 320b) disposed on the non-display area 306 of the display panel 300. An integrated circuit chip 400 may be electrically connected to the signal pads 320 on the non-display area 306. Electronic signals generated by the integrated circuit chip 400 are transmitted through the signal pads 320 via some metal signal traces 340 to the display area 304 of the display panel 300 to thereby drive display-driving units (not shown) within the display area 304. As an example, the display-driving units may be thin film transistors (TFTs).

In the embodiment shown in FIG. 2, the display panel 300 includes a plurality of the metal signal traces 340 disposed on the non-display area 306, and the metal signal traces 340 are vertically interlaced with the signal pads 320. However, the arrangement of the metal signal traces 340 and the signal pads 320 is not limited thereto. For example, the signal pads 320 can be arranged as shown in FIG. 2, and the metal signal traces 340 connected to the top row of the signal pads 320 may extend upward, instead of being arranged parallel with the bottom row of the signal pads 320. In other embodiments, the signal pads 320 can be arranged in multiple rows and the metal signal traces 340 can be straight lines or curved lines disposed on the substrate for electrically connecting to the display area 304. In practical applications, the display panel 304 in the embodiment can be a display panel utilizing a Chip-On-Glass (COG) packing technique, but the invention is not limited thereto.

Figure 3:
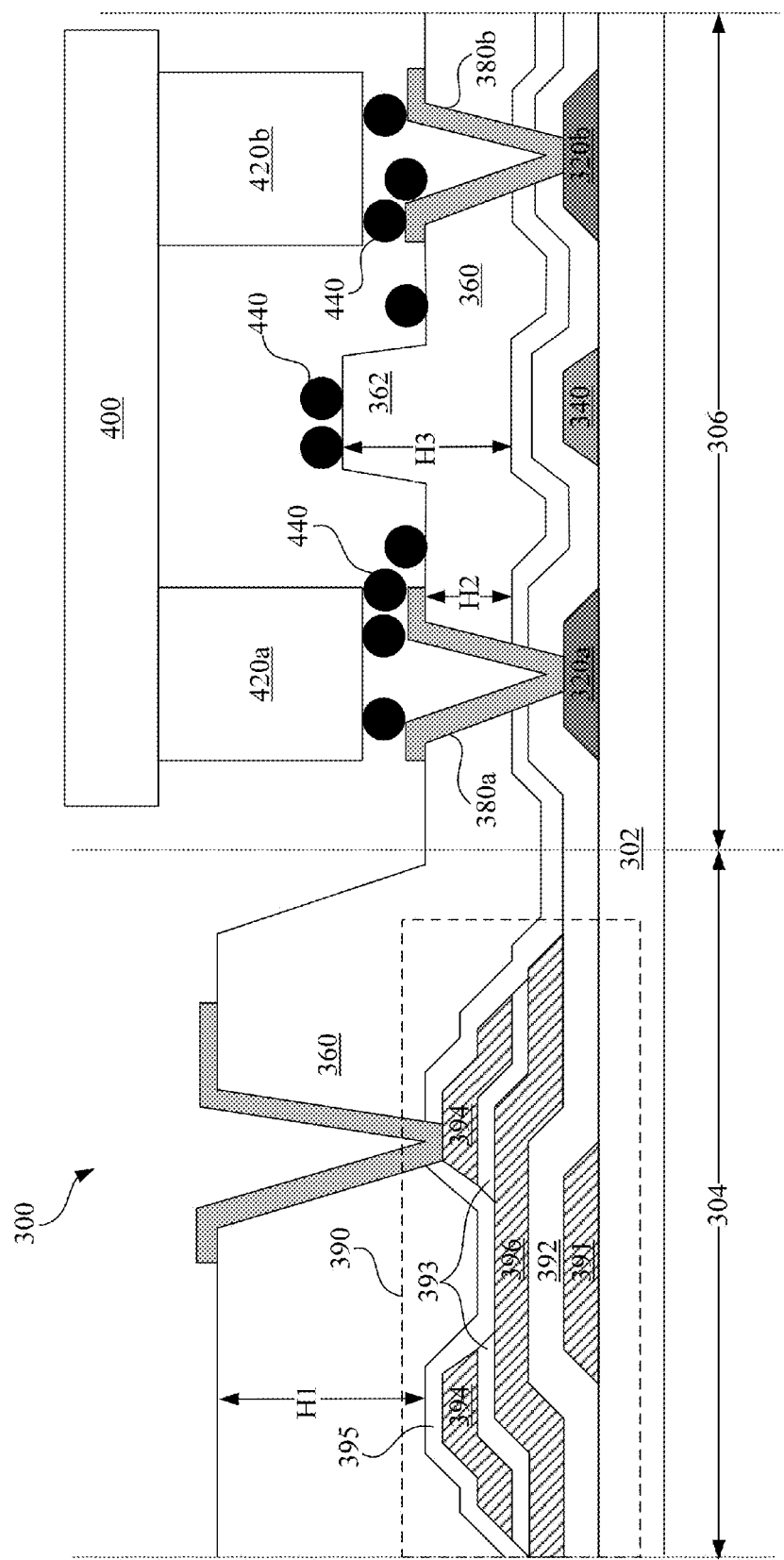
FIG. 3 is a sectional view illustrating the display panel in FIG. 2 along a sectional line A-A.

Reference is also made to FIG. 3, which is a sectional view illustrating the display panel 300 in FIG. 2 along a sectional line A-A. FIG. 3 shows the sectional structure of the display panel 300 including regions from the display area 304 to the second signal pad 320b on the non-display area 306 according to an embodiment.

As shown in FIG. 3, a display-driving unit 390 is disposed on the display area 304 of the display panel 300. The display panel 300 includes a passive covering layer 360. The passive covering layer 360 covers the display-driving unit 390 on the display area 304. The passive covering layer 360 has a first thickness H1 within the display area 304. The passive covering layer 360 can be used for elevating an aperture ratio of the display area 304 on the display panel 300.

As shown in FIG. 3, the display-driving unit 390 in the embodiment may include a first metal layer 391, a gate isolation layer 392, a second metal layer 394, a passivation layer 395 and semiconductor layers. In the embodiment, the semiconductor layers include a high concentration N-type (N+) doping layer 393 and a channel layer 396. The first metal layer 391 is disposed on the substrate 302. The gate isolation layer 392 is disposed on the first metal layer 391. The high concentration N-type doping layer 393 is disposed on the gate isolation layer 392. The second metal layer 394 is disposed on the high concentration N-type doping layer 393. The passivation layer 395 is disposed on the second metal layer 394 and contacted with the gate isolation layer 392. The passive covering layer 360 is disposed on the passivation layer 395. However, the invention is not limited to this structure of the display-driving unit 390.

In the embodiment of the invention, the passive covering layer 360 is disposed on the display area 304 and extends to the non-display area 306. As shown in FIG. 3, the passive covering layer 360 extends to cover the first signal pad 320a and the second signal pad 320b. In the embodiment, the portion of the passive covering layer 360 extended into the non-display area 306 has a second thickness H2. The second thickness H2 is less than the first thickness H1 because there is no need for elevating the aperture ratio on the non-display area 306. A reduced thickness on the non-display area 306 may reduce the total cost of the display panel 300 and allow more space for accommodating wirings or traces for connecting with the integrated circuit chip 400.

As shown in FIG. 3, the non-display area 306 accommodates the first signal pad 320a and a first conductive layer 380a, and the non-display area 306 also accommodates the second signal pad 320b and a second conductive layer 380b. In the embodiment, the first conductive layer 380a and the second conductive layer 380b are formed using the same material (e.g., ITO) and are formed in the same optical mask procedure, but the invention is not limited thereto. The first signal pad 320a is disposed on the substrate 302 within the non-display area 306. The first conductive layer 380a is disposed extending through the passive covering layer 360, and is located above the first signal pad 320a and electrically connected therewith. The first conductive layer 380a is used for forming a conductive path corresponding to the first signal pad 320a. The second signal pad 320b is disposed on the substrate 302 within the non-display area 306. The second conductive layer 380b is disposed extending through the passive covering layer 360, and is located above the second signal pad 320b and electrically connected therewith. The second conductive layer 380b is used for forming a conductive path corresponding to the second signal pad 320b. Therefore, the first conductive layer 380a and the second conductive layer 380b in the embodiment are exposed on the non-display area 306, so as to form an electrical connection with or transmit signals to an external circuitry (e.g., the integrated circuit chip 400).

In the embodiment, the signal pads 320 (i.e., the first signal pad 320a and the second signal pad 320b) on the non-display area 306 are electrically connected to the integrated circuit chip 400 via metal bumps 420a and 420b. The metal bumps 420a and 420b are disposed above the signal pads 320 within the non-display area 306.

During manufacture, the metal bumps 420a and 420b press conductive particles 440 downward to the conductive paths (i.e., the first conductive layer 380a and the second conductive layer 380b) on the first signal pad 320a and the second signal pad 320b, such that the metal bumps 420a and 420b are electrically connected with the first signal pad 320a and the second signal pad 320b, and accordingly the electrical connections between the integrated circuit chip 400 and the signal pads 320a and 320b are formed. The conductive particles 440 can be Anisotropic Conductive Film (ACF) particles, which can be used for attaching the integrated circuit chip 400 on the display panel 300. The conductive particles 440 may also used for transmitting signals between the integrated circuit chip 400 and the display panel 300.

In the embodiment, there is a metal signal trace 340 between the first signal pad 320a and the second signal pad 320b. As described above, the passive covering layer 360 extends from the display area 304 to the non-display area 306. The passive covering layer 360 extends to cover the first signal pad 320a, the metal signal trace 340 and the second signal pad 320b, and the passive covering layer 360 has a second thickness H2 within the non-display area 306.

Figure 1A:
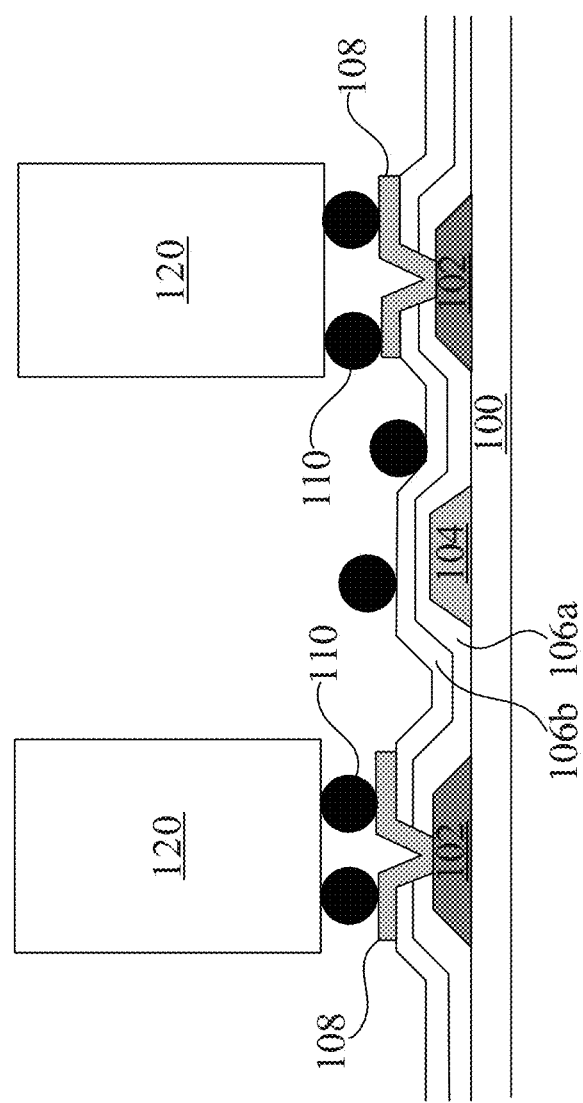
FIG. 1A is a sectional diagram illustrating a non-display area within a traditional display panel.
Figure 1B:
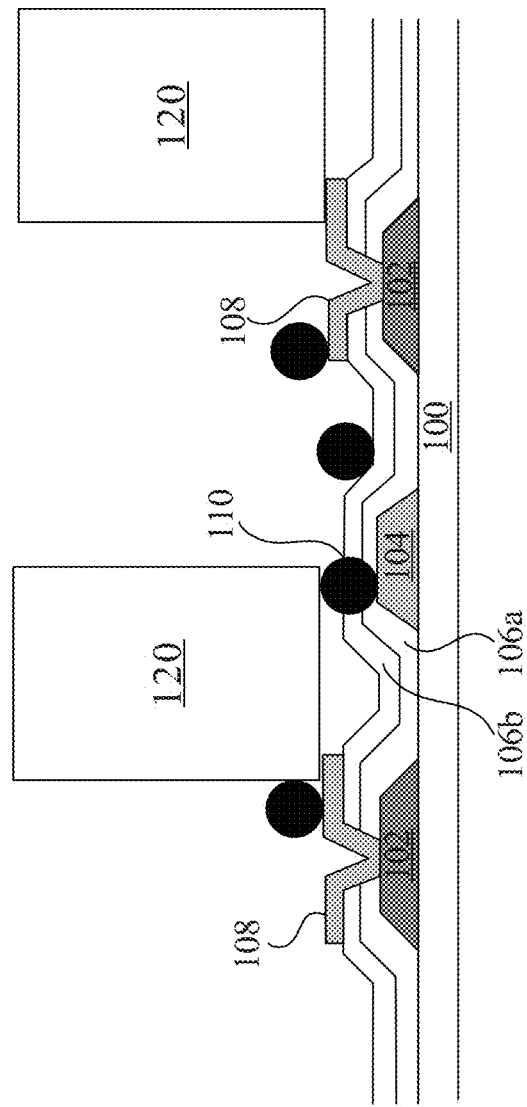

In the embodiment, the passive covering layer 360, which extends from the display area 304 to the non-display area 306, is utilized to enlarge the overall thickness of covering layers (i.e., the total thickness of the passivation layer 395, the gate isolation layer 392 and the passive covering layer 360) on the non-display area 306, so as to prevent the conductive particles 440 from penetrating the covering layers. In some embodiments, the second thickness H2 of the passive covering layer 360 is greater than a diameter of the conductive particles 440. In this case, even when shifting errors occur in the pressing process of the integrated circuit bumps (i.e., the metal bumps 420a and 420b), the conductive particles 440 will be pressed downward and partially buried in the passive covering layer 360 without completely penetrating the passive covering layer 360, so as to prevent the metal signal traces 340 from being short-circuited to the first or second signal pads 320a or 320b when the conductive particles 440 penetrate the passive covering layer 360. This is contrast to the situation with respect to the conventional configuration described with reference to FIG. 1B. In other words, even when shifting errors occur in the pressing process of the integrated circuit bumps 420a and 420b, the passive covering layer 360 can ensure that the covering structure above the metal signal traces 340 is not fully penetrated. In this case, the tolerance range of the Chip-On-Glass packing technique is such that overlapping of the area above the metal signal traces 340 is permissible. In the embodiment, the passive covering layer 360 on the non-display area 306 extended from the display area 304 can be formed in one common process on two areas. Therefore, no extra process is needed to enlarge the overall thickness of the covering layers on the non-display area 306 in the embodiment.

Furthermore, the passive covering layer 360 may further include a protruding structure 362 in the embodiment of the invention. As shown in FIG. 3, the protruding structure 362 on the passive covering layer 360 is located above the metal signal trace 340, and a vertical projection of the protruding structure 362 overlaps the metal signal trace 340. The protruding structure 362 forms a third thickness H3 on the passive covering layer 360 above the metal signal trace 340. The third thickness H3 is greater than the second thickness H2, such that the anti-penetration effect can be enhanced.

In addition, the protruding structure 362 can form a stepped configuration between the first signal pad 320a and the second signal pad 320b. As a result, a beaded drainage of conductive particles 440 can be prevented from being formed between the first signal pad 320a and the second signal pad 320b, such that a short-circuit from the first signal pad 320a to the first conductive layer 380a (or from the second signal pad 320b to the second conductive layer 380b) can be prevented. This is contrast to the conventional configuration described with reference to FIG. 1C.

The horizontal location of the protruding structure 362 on the passive covering layer 360 is not limited to that corresponding to right above the metal signal trace 340. In another embodiment, the horizontal location of the protruding structure 362 on the passive covering layer 360 can be placed at any location between the first signal pad 320a and the second signal pad 320b, and need not vertically overlap with the metal signal trace 340. In another embodiment, the horizontal location of the protruding structure 362 on the passive covering layer 360 can be placed at any location between the first conductive layer 380a and the second conductive layer 380b, and need not vertically overlap with the metal signal trace 340. All of aforesaid arrangements can be utilized to avoid the formation of a beaded drainage of the conductive particles 440.

In the aforesaid embodiments, the protruding structure 362 is disposed above the metal signal trace 340 between the first signal pad 320a and the second signal pad 320b or between the first conductive layer 380a and the second conductive layer 380b for forming a stepped configuration and avoiding the formation of a beaded drainage of the conductive particles 440, but the invention is not limited thereto.

Figure 4:
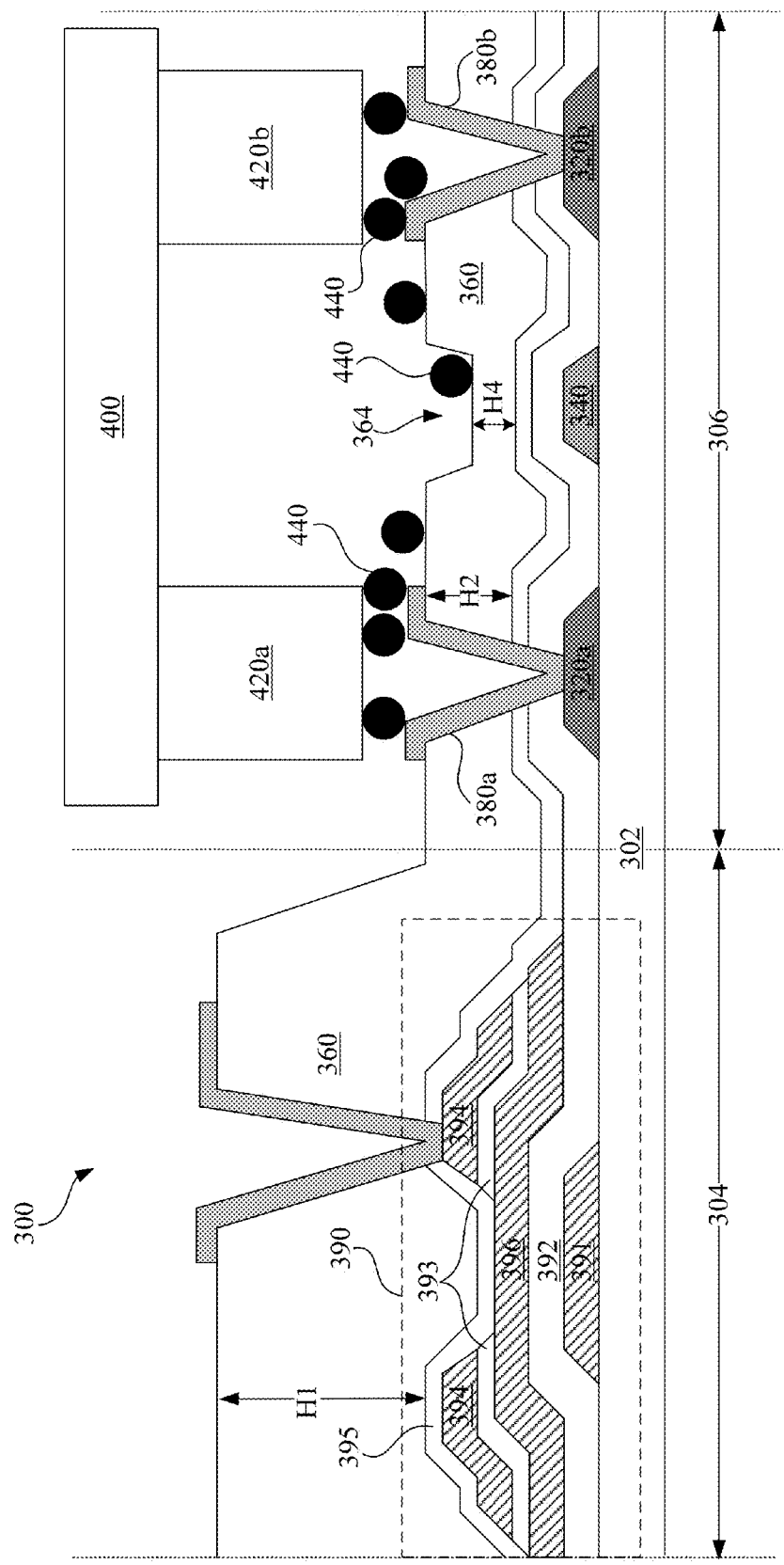
FIG. 4 is a sectional view illustrating the display panel according to another embodiment of the invention.

Reference is made to FIG. 4, which is a sectional view of the display panel 300 according to another embodiment of the invention. In this embodiment, a concave structure 364 is formed on the passive covering layer 360. The concave structure 364 is formed on the passive covering layer 360 above the metal signal trace 340, between the first signal pad 320a and the second signal pad 320b or between the first conductive layer 380a and the second conductive layer 380b. The concave structure 364 can be utilized to enlarge the space where the conductive particles 440 distribute. One or more of the conductive particles 440 may become trapped in the concave structure 364. The concave structure 364 forms a stepped configuration to thereby prevent the formation of a beaded drainage of the conductive particles 440. It is noted that the horizontal location of the concave structure 364 on the passive covering layer 360 is not limited to the embodiment shown in FIG. 4. For example, the horizontal location of the concave structure 364 on the passive covering layer 360 can be placed at any location between the first signal pad 320a and the second signal pad 320b or any location between the first conductive layer 380a and the second conductive layer 380b. All of aforesaid arrangements can be utilized to avoid the formation of a beaded drainage of the conductive particles 440.

In the embodiment, the passive covering layer 360 with the concave structure 364 above the metal signal trace 340 has a fourth thickness H4. The fourth thickness H4 is less than the second thickness H2. Therefore, a vertical gap can be formed to accommodate one or more of the conductive particles 440. In addition, in order to avoid the penetration of the conductive particles 440 as discussed above, the overall thickness corresponding to the concave structure 364, that is, a total thickness formed by three layers of the passive covering layer 360, which has the fourth thickness H4, the passivation layer 395 and the gate isolation layer 392, is greater than the diameter of the conductive particles 440 in non-display area 306. In this case, even when shifting errors occur in the pressing process of the integrated circuit bumps (i.e., the metal bumps 420a and 420b), the conductive particles 440 will be pressed downward and partially buried in the passive covering layer 360 without completely penetrating all of the covering layers (i.e., the passive covering layer 360, the passivation layer 395 and the gate isolation layer 392), but the invention is not limited thereto. For example, a similar effect can be achieved by simply ensuring that the fourth thickness H4 of the passive covering layer 360 is greater than the diameter of the conductive particles 440.

As mentioned in aforesaid paragraphs, the passive covering layer of the display panel disclosed in the invention is disposed on a display area of the display panel. The passive covering layer can be used to elevate an aperture ratio of the display area, and the passive covering layer extends to cover at least a portion of a non-display area of the display panel. The passive covering layer extending to the non-display area may provide a specific thickness in order to prevent the conductive particles from penetrating an isolation structure and electrically connecting to metal signal traces under the isolation structure. Furthermore, a protruding structure or a concave structure can be formed on or in the passive covering layer between two signal pads, so as to prevent the formation of a beaded drainage of the conductive particles.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded with the broadest interpretation so as to encompass all such modifications and similar structures.

What is claimed is:

1. A display panel, comprising:
   a display area;
   a non-display area adjacent to the display area;
   a plurality of signal pads disposed within the non-display area;
   a metal signal trace disposed within the non-display area and passing through a clearance between two adjacent ones of the signal pads;
   a passive covering layer disposed on the display area and extending to cover the metal signal trace within the non-display area, the passive covering layer having a first thickness within the display area, the passive covering layer having a second thickness within the non-display area, wherein the first thickness is greater than the second thickness;
   two conductive layers formed on the passive covering layer in the non-display area and electrically connected to the two adjacent ones of the signal pads respectively, wherein a portion of the passive covering layer is exposed between the two conductive layers; and
   a concave structure formed on the exposed portion of the passive covering layer between the two conductive layers and at a position right above the clearance between the two adjacent ones of the signal pads, the concave structure being overlapped with the metal signal trace, and the concave structure electrically isolates the two conductive layers, wherein the concave structure forms a fourth thickness on the passive covering layer above the metal signal traces, and the fourth thickness is greater than zero but less that the second thickness.

2. The display panel as claimed in claim 1, further comprising an integrated circuit chip and a plurality of metal bumps, the metal bumps being disposed above the signal pads within the non-display area, the metal bumps being electrically connected to the signal pads and to the integrated circuit chip.

3. The display panel as claimed in claim 2, further comprising a plurality of conductive particles, at least some of the conductive particles being disposed between the metal bumps and the two conductive layers, so as to electrically connect the metal bumps to the signal pads.

4. The display panel as claimed in claim 3, wherein the second thickness is greater than a diameter of the conductive particles.

5. A display panel, comprising:
a display area;
a non-display area adjacent to the display area;
a plurality of signal pads disposed within the non-display area;
a metal signal trace disposed within the non-display area and passing through a clearance between two adjacent ones of the signal pads;
a passive covering layer disposed on the display area and extending to cover the metal signal trace within the non-display area, the passive covering layer having a first thickness within the display area, the passive covering layer having a second thickness within the non-display area, wherein the first thickness is greater than the second thickness;
two conductive layers disposed on the passive covering layer in the non-display area, wherein the two conductive layers are electrically connected to the two adjacent ones of the signal pads respectively; and
a concave structure formed on the passive covering layer, the concave structure being at a position right above the clearance between the two adjacent ones of the signal pads and overlapped with the metal signal trace, wherein a bottom surface of the concave structure is below the two conductive layers.

6. A display panel, comprising:
a display area;
a non-display area adjacent to the display area;
a plurality of signal pads disposed within the non-display area;
a metal signal trace disposed within the non-display area and passing through a clearance between two adjacent ones of the signal pads;
a passive covering layer disposed on the display area and extending to cover the metal signal trace within the non-display area, the passive covering layer having a first thickness within the display area, the passive covering layer having a second thickness within the non-display area, wherein the first thickness is greater than the second thickness;
a concave structure formed on the passive covering layer at a position right above the clearance between the two adjacent ones of the signal pads, wherein the concave structure is overlapped with the metal signal trace; and
two conductive layers disposed on the passive covering layer in the non-display area, the two conductive layers being electrically connected to the two adjacent ones of the signal pads respectively, wherein the concave structure is disposed between but not in contact with the two conductive layers.

7. A display panel, comprising:
a display area;
a non-display area adjacent to the display area;
a plurality of signal pads disposed within the non-display area;
a metal signal trace disposed within the non-display area and passing through a clearance between two adjacent ones of the signal pads;
a passive covering layer disposed on the display area and extending to cover the metal signal trace within the non-display area, the passive covering layer having a first thickness within the display area, the passive covering layer having a second thickness within the non-display area, wherein the first thickness is greater than the second thickness; and
a concave structure formed on the passive covering layer at a position right above the clearance between the two adjacent ones of the signal pads, wherein the concave structure is overlapped with the metal signal trace, and a bottom surface of the concave structure extends on a level different from a top surface of the passive covering layer at a position overlapped with one of the signal pads.

8. A display panel, comprising:
a display area;
a non-display area adjacent to the display area;
a plurality of signal pads disposed within the non-display area;
a metal signal trace disposed within the non-display area and passing through a clearance between two adjacent ones of the signal pads;
a passive covering layer disposed on the display area and extending to cover the metal signal trace within the non-display area, the passive covering layer having a first thickness within the display area, the passive covering layer having a second thickness within the non-display area, wherein the first thickness is greater than the second thickness;
a plurality of metal bumps electrically connected to the signal pads within the non-display area;
an integrated circuit chip contacted with the metal bumps, wherein the metal bumps electrically connect the signal pads and the integrated circuit chip;
a concave structure formed on the passive covering layer at a position right above the clearance between the two adjacent ones of the signal pads, wherein the concave structure is disposed between the metal bumps, and the concave structure electrically isolates the metal bumps.

* * * * *